United States Patent
Wang et al.

(10) Patent No.: US 11,631,585 B2
(45) Date of Patent: Apr. 18, 2023

(54) ETCHING MASK, METHOD FOR FABRICATING THE SAME, AND METHOD FOR FABRICATING A SEMICONDUCTOR STRUCTURE USING THE SAME

(71) Applicant: NANYA TECHNOLOGY CORPORATION, New Taipei (TW)

(72) Inventors: Jui-Seng Wang, New Taipei (TW); Yu-Chen Huang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 222 days.

(21) Appl. No.: 17/147,482

(22) Filed: Jan. 13, 2021

(65) Prior Publication Data

US 2022/0223414 A1 Jul. 14, 2022

(51) Int. Cl.
*H01L 21/033* (2006.01)
*H01L 21/311* (2006.01)
*H01L 21/768* (2006.01)
*H01L 21/027* (2006.01)

(52) U.S. Cl.
CPC ...... *H01L 21/0337* (2013.01); *H01L 21/0274* (2013.01); *H01L 21/31144* (2013.01); *H01L 21/76802* (2013.01); *H01L 21/76883* (2013.01)

(58) Field of Classification Search
CPC ............ H01L 21/0337; H01L 21/0274; H01L 21/31144; H01L 21/76802; H01L 21/76883
USPC ........................................................ 438/669
See application file for complete search history.

(56) References Cited

U.S. PATENT DOCUMENTS

| 2004/0152296 | A1* | 8/2004 | Matz | H01L 21/76808 438/623 |
| 2004/0157163 | A1* | 8/2004 | Chen | H01L 21/31144 430/311 |
| 2021/0134980 | A1* | 5/2021 | Lee | H01L 29/42376 |
| 2022/0102150 | A1* | 3/2022 | Tung | H01L 21/0273 |

* cited by examiner

*Primary Examiner* — Caleen O Sullivan
(74) *Attorney, Agent, or Firm* — CKC & Partners Co., LLC (57) ABSTRACT

A method for fabricating a semiconductor structure includes: providing a substrate and a dielectric layer on the substrate; and forming an etching mask on the dielectric layer; and etching the dielectric layer using the etching mask to form at least one opening therein. The etching mask includes: a hard mask layer, a photoresist layer, and a hexamethyldisilazane (HMDS) layer. The photoresist layer is located over the hard mask layer, and the HMDS layer is located between the hard mask layer and the photoresist layer.

19 Claims, 13 Drawing Sheets

ETCHING MASK, METHOD FOR FABRICATING THE SAME, AND METHOD FOR FABRICATING A SEMICONDUCTOR STRUCTURE USING THE SAME

BACKGROUND

Field of Invention

The present invention relates to a hard mask, a method for fabricating the same, and a method for fabricating a semiconductor structure using the same.

Description of Related Art

Etching is used in microfabrication to chemically remove layers from the surface of a wafer during manufacturing. Etching is a critically important process module, and every wafer undergoes many etching steps before it is complete.

Therefore, etching mask such as photoresist also plays a vital role in semiconductor manufacturing field. Nevertheless, deficiency on the photoresist may damage the structure under the photoresist when an etching process is performed thereon. Therefore, there is a need to solve the problems caused by the deficiency, so as to improve the yield rate of semiconductor manufacturing.

SUMMARY

The invention provides a method for fabricating an etching mask includes: forming a hard mask layer; forming a hexamethyldisilazane (HMDS) layer on the hard mask layer; and forming a photoresist layer on the HMDS layer.

In some embodiments of the present disclosure, the HMDS layer is formed by a vapor prime process.

In some embodiments of the present disclosure, forming the hard mask layer includes: forming a carbon-containing hard mask; and forming a silicon-containing hard mask on the carbon-containing hard mask.

In some embodiments of the present disclosure, the carbon-containing hard mask is a spin-on carbon hard mask.

In some embodiments of the present disclosure, the silicon-containing hard mask is a spin-on silicon hard mask.

The invention also provides an etching mask comprising: a hard mask layer; a HMDS layer disposed on the hard mask layer; and a photoresist layer disposed on the HMDS layer.

In some embodiments of the present disclosure, the hard mask layer includes a carbon-containing hard mask and a silicon-containing hard mask disposed on the carbon-containing hard mask.

In some embodiments of the present disclosure, the carbon-containing hard mask is a spin-on carbon hard mask.

In some embodiments of the present disclosure, the silicon-containing hard mask is a spin-on silicon hard mask.

The invention also provides a method for fabricating an semiconductor structure includes: providing a substrate and a dielectric layer on the substrate; forming an etching mask on the dielectric layer, in which the etching mask includes: a hard mask layer; a photoresist layer disposed on the hard mask layer; and a HMDS layer disposed between the hard mask layer and the photoresist layer; and etching the dielectric layer using the etching mask to form at least one opening therein.

In some embodiments of the present disclosure, etching the dielectric layer using the etching mask to form the at least one opening therein includes: patterning the photoresist layer; patterning the hard mask layer using the patterned photoresist layer; and etching the dielectric layer using the patterned hard mask layer to form the at least one opening.

In some embodiments of the present disclosure, the hard mask layer includes a carbon-containing hard mask and a silicon-containing hard mask disposed on the carbon-containing hard mask.

In some embodiments of the present disclosure, the carbon-containing hard mask is a spin-on carbon hard mask.

In some embodiments of the present disclosure, the silicon-containing hard mask is a spin-on silicon hard mask.

In some embodiments of the present disclosure, the HMDS layer is formed by a vapor prime process.

In some embodiments of the present disclosure, the method further includes forming at least one multi-layer structure extending through the dielectric layer.

In some embodiments of the present disclosure, the at least one multi-layer structure includes a conductive film and a dielectric film disposed on the conductive film.

In some embodiments of the present disclosure, the at least one multi-layer structure further includes a polycrystalline layer disposed under the conductive film.

In some embodiments of the present disclosure, the at least one multi-layer structure further includes a HMDS film which is disposed between the hard mask layer and the dielectric film.

In some embodiments of the present disclosure, the method further includes: forming a metal layer on the dielectric layer, in which the metal layer fills the at least one opening; and performing a litho-etch process to the metal layer to form metal features and at least one metal contact.

In summary, the present disclosure provides a multi-layer etching mask which has a HMDS layer between a photoresist layer and a hard mask layer. Therefore, the HMDS layer can provide adhesion therebetween, thus the hard mask layer can protect the structure under the multi-layer etching mask from being damaging by a deficiency thereon.

It is to be understood that both the foregoing general description and the following detailed description are by examples, and are intended to provide further explanation of the invention as claimed.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present invention. These are, of course, merely examples and are not intended to be limiting. For example, the formation of a first feature over or on a second feature in the description that follows may include embodiments, in which the first and second features are formed in direct contact, and may also include embodiments, in which additional features may be formed between the first and second features, such that the first and second features may not be in direct contact. In addition, the present invention may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
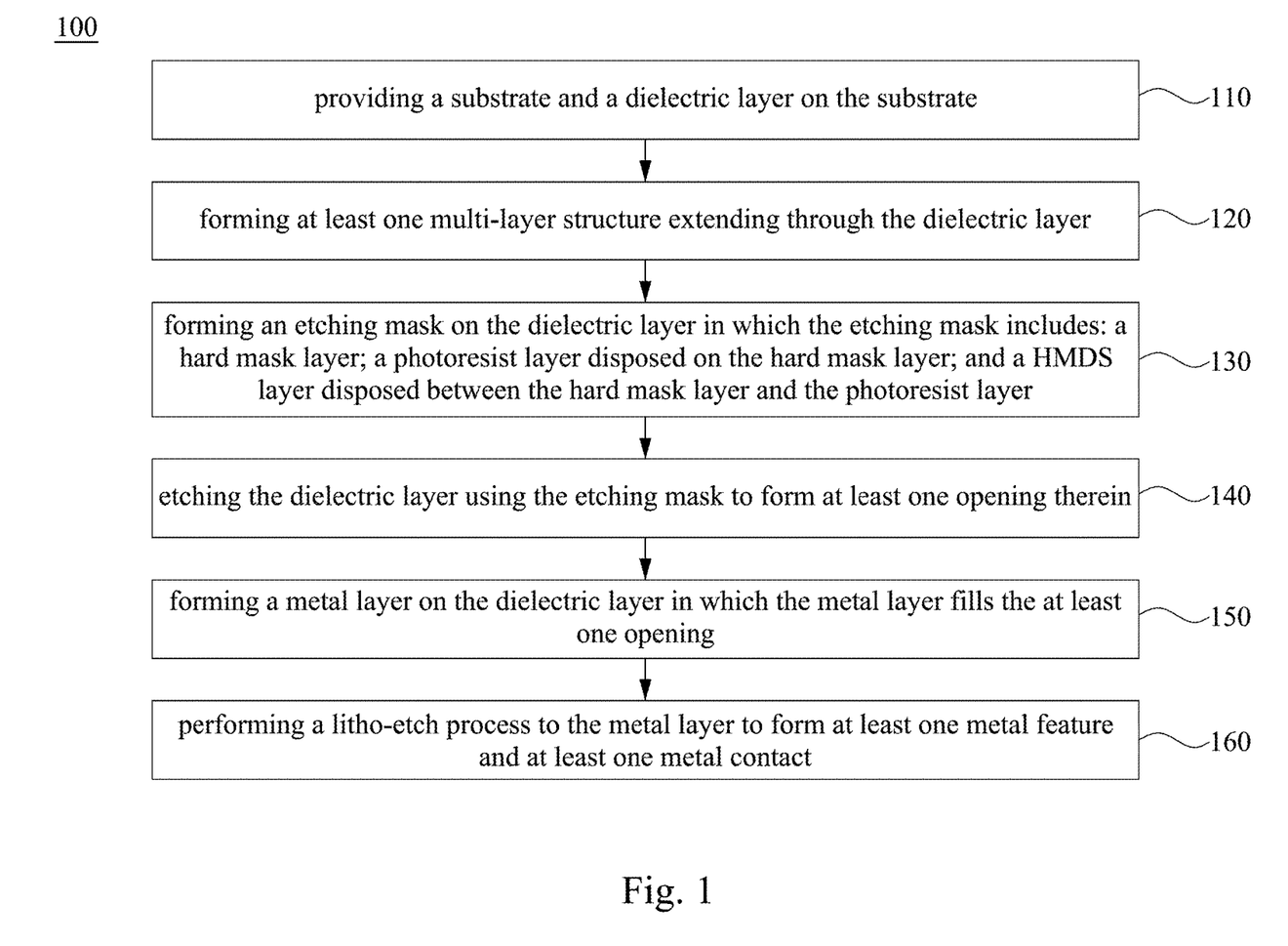
FIG. 1 is a flowchart of a method for fabricating a semiconductor device in accordance with some embodiments of the present invention.

Reference is made to FIG. 1. FIG. 1 illustrates a flowchart of a method 100 for fabricating a semiconductor device in accordance with some embodiments of the present invention. The method 100 starts from a step 110, which includes providing a substrate and a dielectric layer on the substrate. Thereafter, the method 100 continues with a step 120, which includes forming at least one multi-layer structure extending through the dielectric layer. The method 100 continues with a step 130, which includes forming an etching mask on the dielectric layer, in which the etching mask includes: a hard mask layer; a photoresist layer which is disposed on the hard mask layer; and a hexamethyldisilazane ($[(CH_3)_3Si]_2NH$, HMDS) layer which is disposed between the hard mask layer and the photoresist layer. The method 100 continues with a step 140, which includes etching the dielectric layer using the etching mask to form at least one opening therein. Next, the method 100 continues with a step 150, which includes forming a metal layer on the dielectric layer, in which the metal layer fills the at least one opening. The method 100 continues with a step 160, which includes performing a litho-etch process to the metal layer to form metal features and at least one metal contact.

Figure 2:
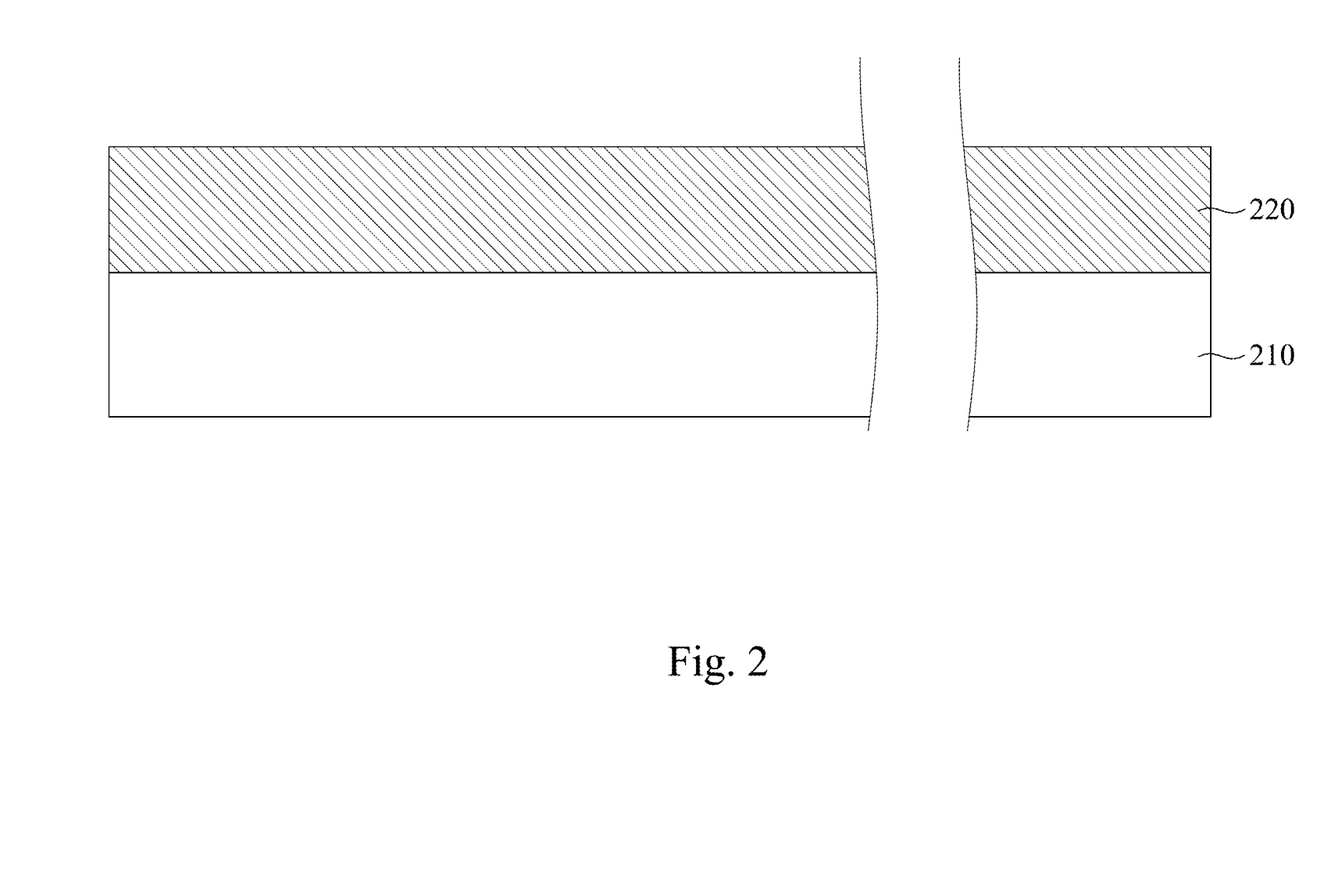
FIGS. 2-12 are cross-sectional views of intermediate stages of a method for fabricating a semiconductor device in accordance with some embodiments of the present invention.

FIGS. 2-12 are cross-sectional views of intermediate stages of the method 100 for fabricating a semiconductor device in accordance with some embodiments of the present invention. Reference is made to FIG. 2. FIG. 2 can represent the step 110 which includes providing a substrate 210 and a dielectric layer 220 on the substrate 210. The substrate 210 may be a semiconductor substrate, such as a bulk semiconductor or the like, which may be doped (e.g., with a p-type or an n-type dopant) or undoped. In some embodiments of the present disclosure, the substrate 210 may be a silicon wafer, and other suitable substrates, such as a multi-layered substrate (e.g., a semiconductor-on-insulator (SOI) substrate), a gradient substrate, or the like, may also be used. The semiconductor material of the substrate 210 may include silicon, germanium, a compound semiconductor (e.g., silicon carbide, gallium arsenic, gallium phosphide, indium phosphide, indium arsenide, etc.), an alloy semiconductor, or combinations thereof. A wide variety of electrical components (e.g., transistors, capacitors, resistors, combinations of these, and the like) may be used to generate the structural and functional requirements of the design for the substrate 210. The dielectric layer 220 includes a dielectric material such as silicon dioxide ($SiO_2$), and the dielectric layer 220 can be formed by spin-coating, laminating, or other suitable deposition techniques. In some embodiments of the present disclosure, the dielectric layer 220 can be formed by physical vapor deposition (PVD), chemical vapor deposition (CVD), plasma enhanced chemical vapor deposition (PECVD), etc. The present disclosure is not limited in this respect.

Figure 3:
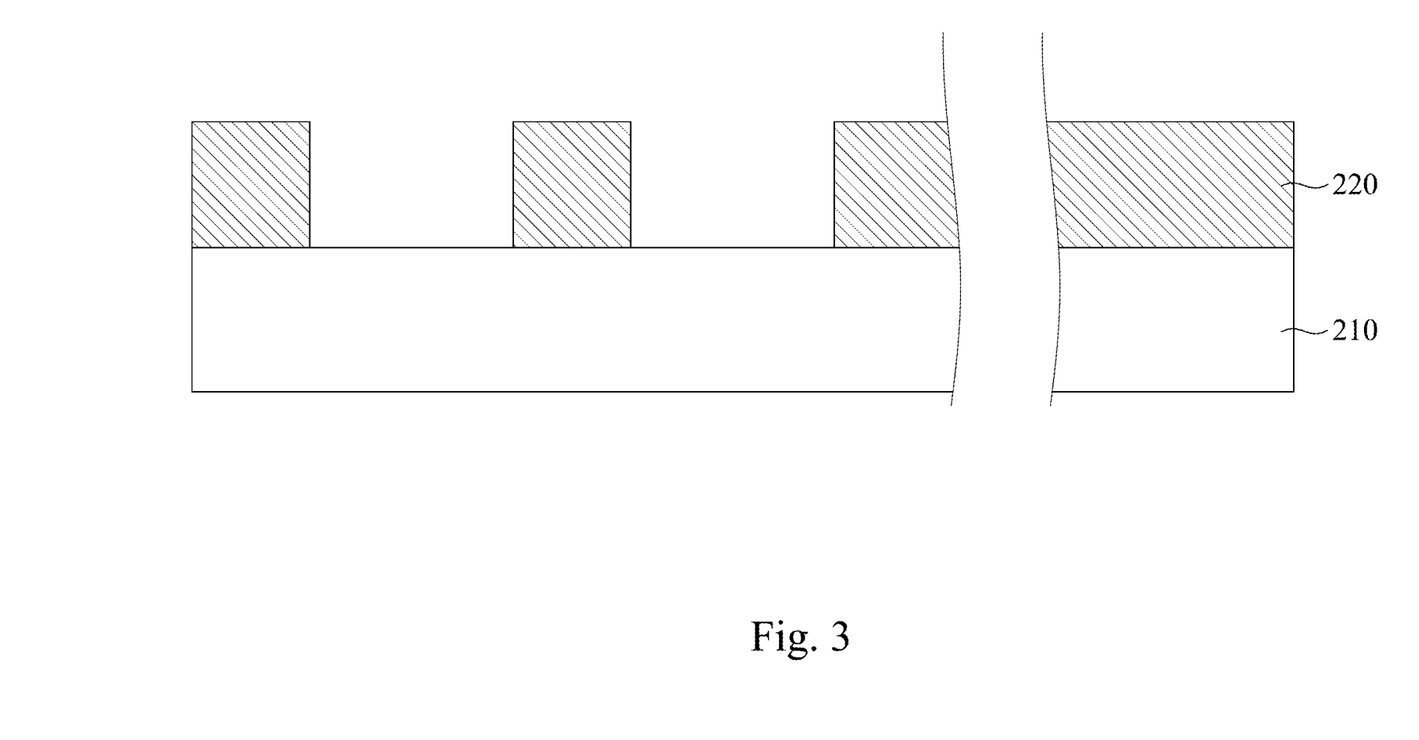
Figure 4:
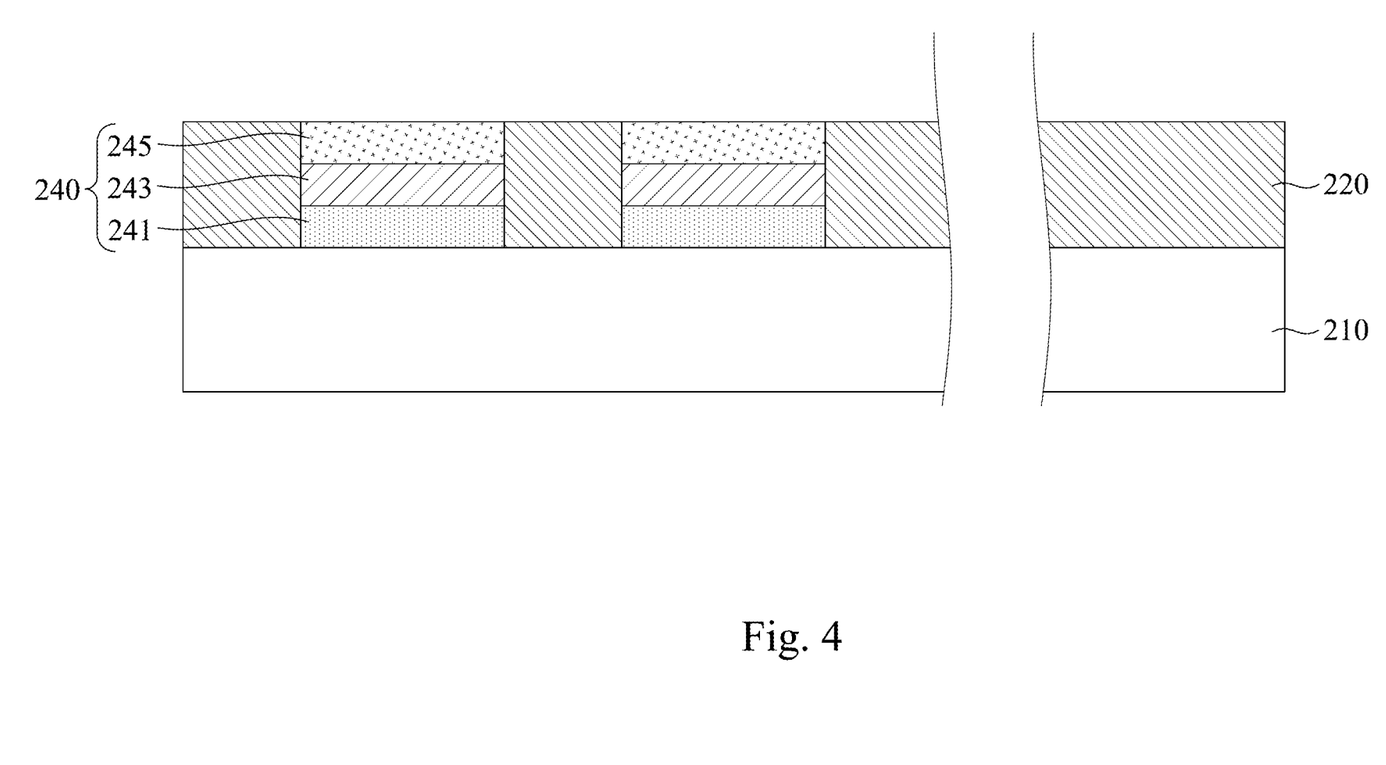

Reference is made to FIG. 3 and FIG. 4. The step 120 can be represented by FIG. 3 and FIG. 4, in which the step 120 includes forming at least one multi-layer structure 240 extending through the dielectric layer 220. In FIG. 3, at least one through hole H1 is formed in the dielectric layer 220, in which the through hole H can be formed by any suitable litho-etch process. In FIG. 4, the multi-layer structure 240 is formed in the through hole H, and the multi-layer structure 240 includes a conductive film 243 and a dielectric film 245 which is disposed over the conductive film 243. Moreover, the multi-layer structure 240 further includes a polycrystalline layer 241 which is disposed under the conductive film 243. Specifically, the conductive film 243 is made of a conductive material such as tungsten, aluminum, copper, titanium, tantalum, titanium nitride, tantalum nitride, or the alloys thereof. The dielectric film 245 is made of a dielectric material such as silicon nitride ($Si_3N_4$). In addition, the multi-layer structure 240 can be formed by any suitable deposition process, such as CVD, PECVD, Low-Pressure Chemical Vapor Deposition, (LPCVD), and Atomic Layer Deposition (ALD). The present disclosure is not limited in this respect.

Reference is made from FIG. 5 through FIG. 8. FIG. 5 through FIG. 8 can represent the step 130 of the method 100, in which the step 130 includes forming an etching mask 230 on the dielectric layer 220. In some embodiments of the present disclosure, the etching mask 230 includes the hard mask layer 231, the HMDS layer 233, and the photoresist layer 235. The HMDS layer 233 is disposed on the hard mask layer 231, and the photoresist layer 235 is disposed on the hard mask layer 231 as well as the HMDS layer 233. In other words, the HMDS layer 233 is disposed between the hard mask layer 231 and the photoresist layer 235.

Figure 5:
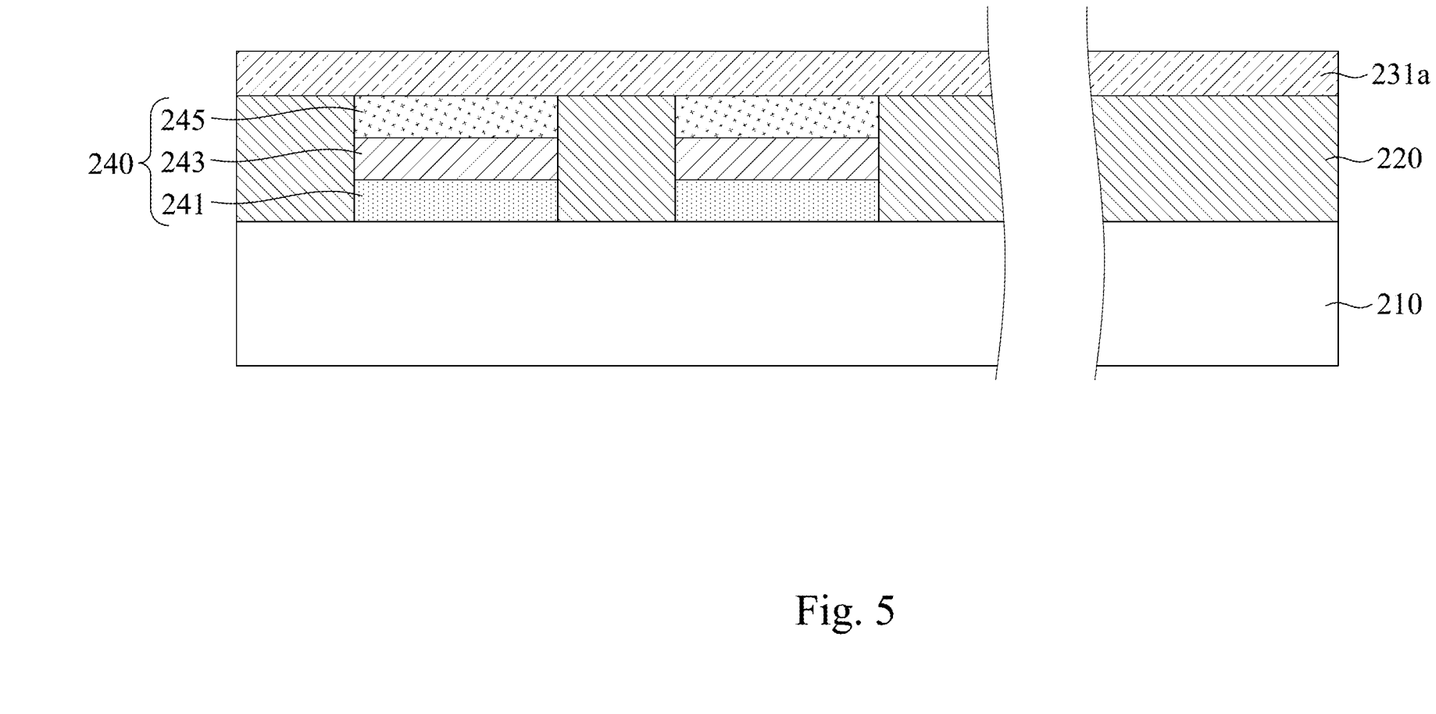
Figure 6:
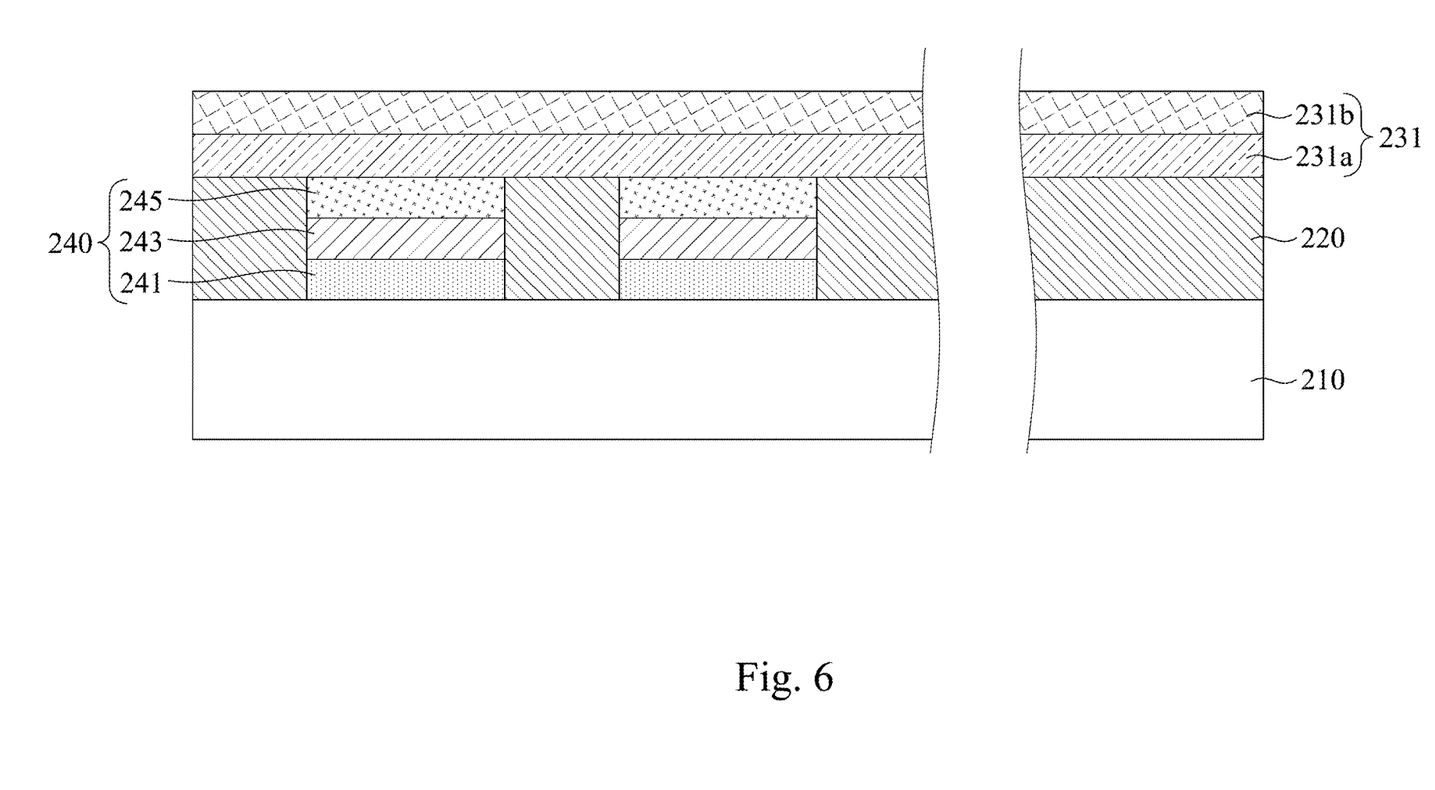

Specifically, the hard mask layer 231 includes a carbon-containing hard mask 231a and a silicon-containing hard mask 231b which is disposed on the carbon-containing hard mask 231a. In FIGS. 5 and 6, the carbon-containing hard mask 231a is formed over the dielectric layer 220 and the multi-layer structure 240, and then the silicon-containing hard mask 231b is formed on the carbon-containing hard mask 231a. The carbon-containing hard mask 231a and the silicon-containing hard mask 231b can be formed by spin coating. Thus, the carbon-containing hard mask 231a can be a spin-on carbon hard mask, and the silicon-containing hard mask 231b can be a spin-on silicon hard mask. The present disclosure is not limited in this respect.

Figure 7:
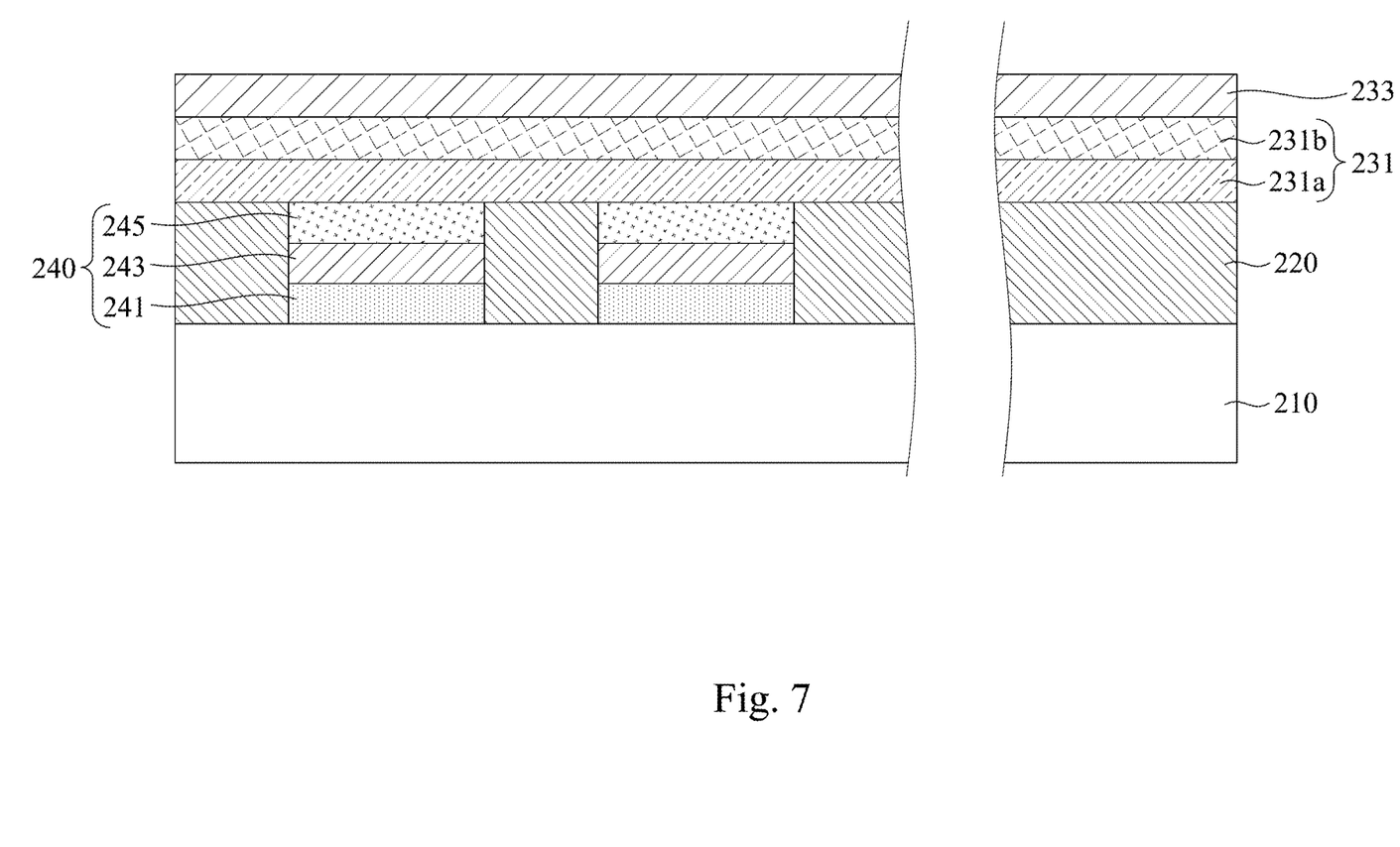
Figure 8:
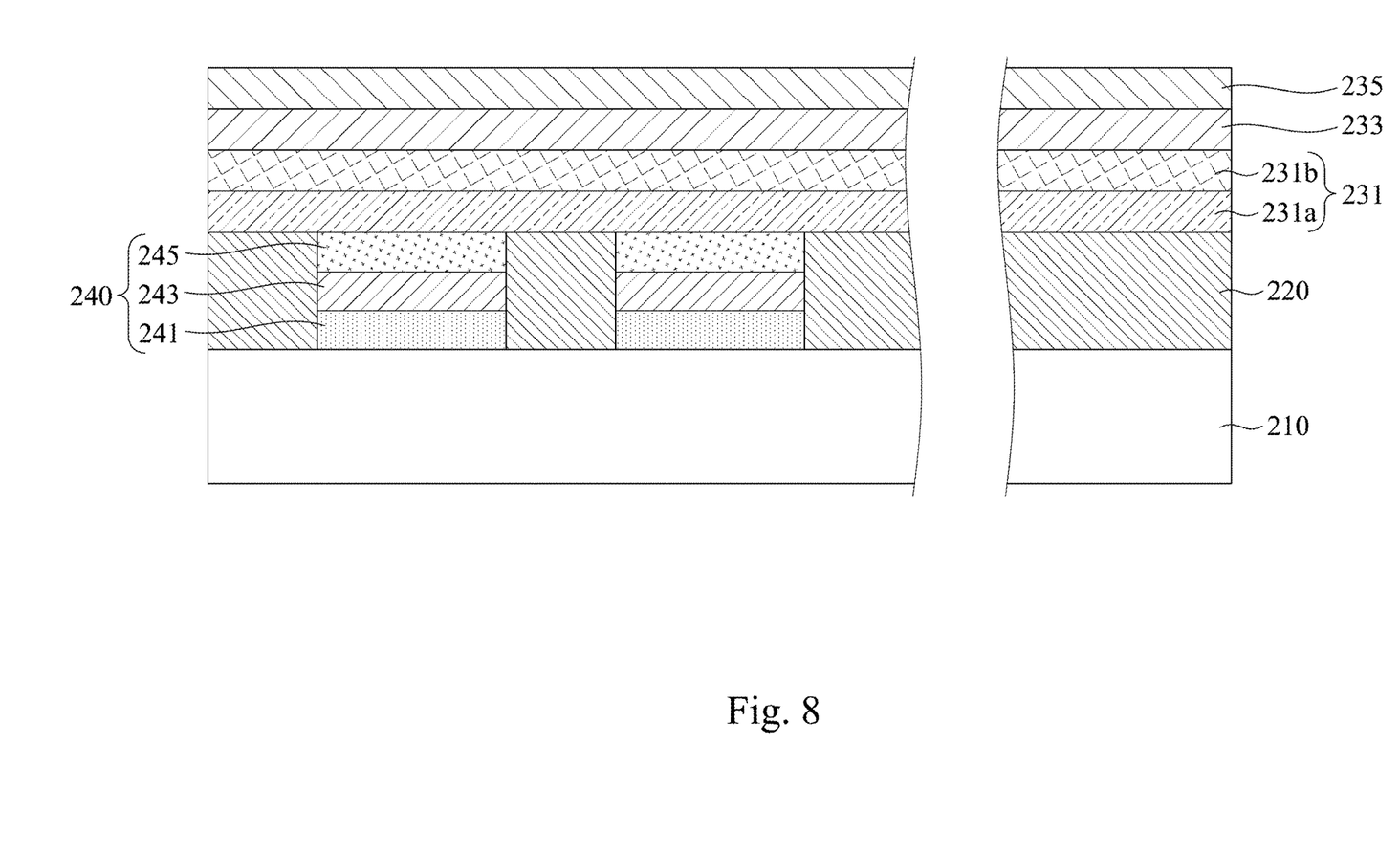

In FIG. 7, the HMDS layer 233 is formed on the hard mask layer 231 such as the silicon-containing hard mask 231b, in which the HMDS layer 233 can be formed by a vapor prime process. In FIG. 8, the photoresist layer 235 is formed on the HMDS layer 233, thus the HMDS layer 233 is between the hard mask layer 231 and the photoresist layer 235. The photoresist layer 235 which is a positive photoresist layer or a negative photoresist layer can be formed by spin-coating. The present disclosure is not limited in this respect.

Figure 7A:
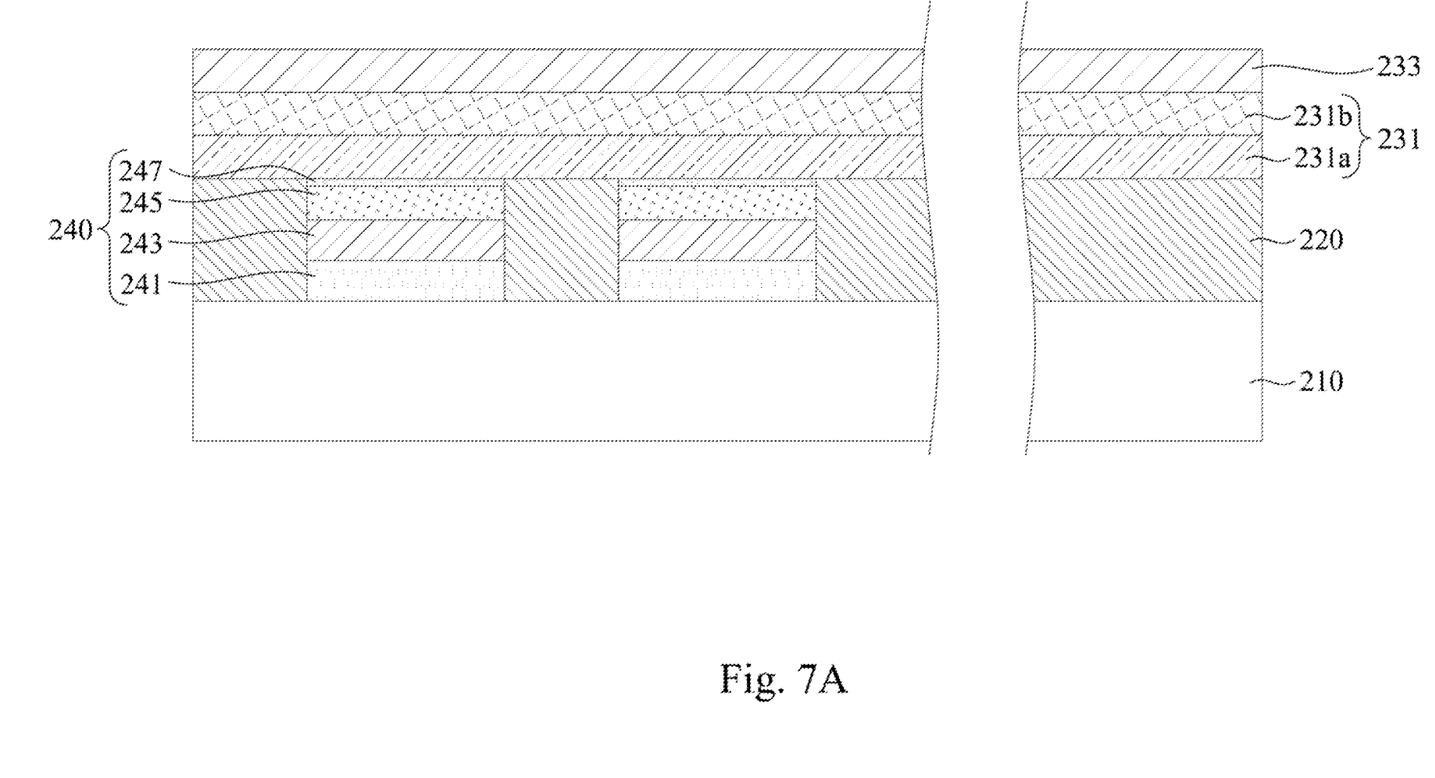

In some embodiments of the present disclosure, as illustrated in FIG. 7A, the at least one multi-layer structure 240 further includes a HMDS film 247 which is disposed on the dielectric film 245, in which the HMDS film 247 between the hard mask layer 231 and the dielectric film 245. The HMDS film 247 can be formed by a vapor prime process, in which the HMDS film 247 can increase the adhesion between the dielectric film 245 and the hard mask layer 231 such as the carbon-containing hard mask 231a. The present disclosure is not limited in this respect.

Figure 9:
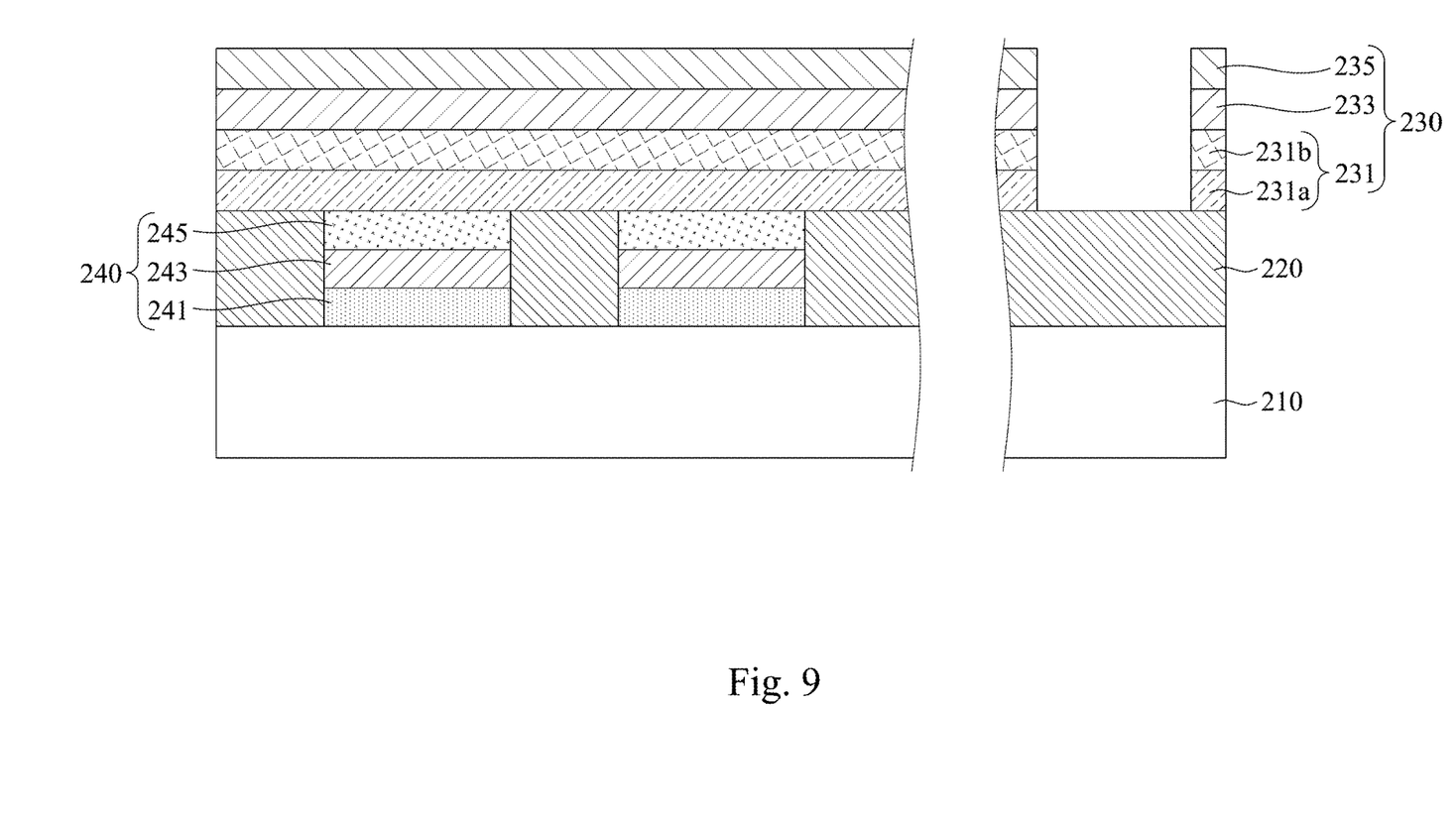
Figure 10:
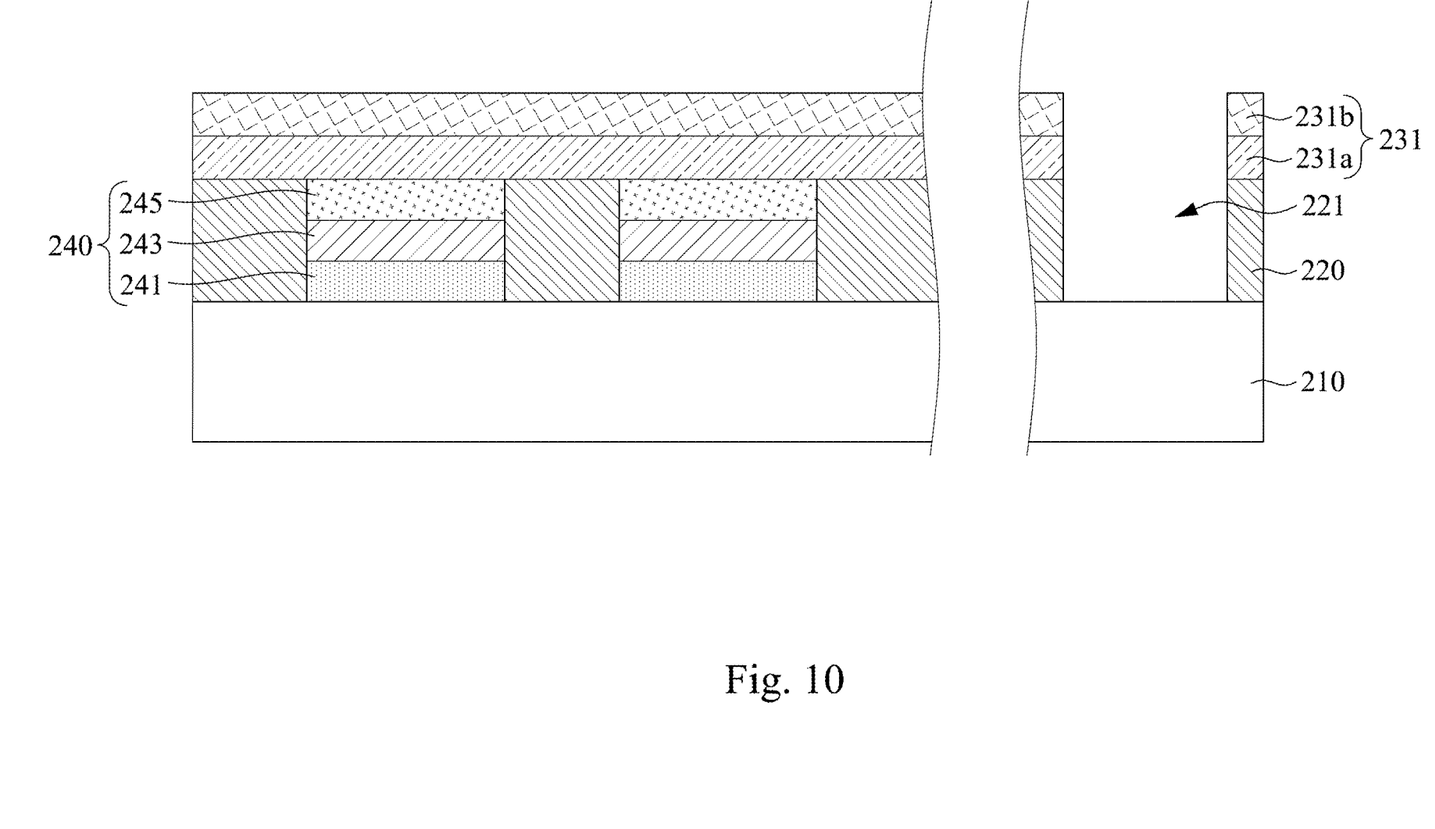

Reference is made to FIGS. 9 and 10. FIGS. 9 and 10 can represent the step 140, in which the step 140 includes etching the dielectric layer 220 with the etching mask 230 to form the at least one opening 221 therein. In FIG. 9, the photoresist layer 235 is patterned, and then the hard mask layer 231 is etched and patterned with the patterned photoresist layer 235. Thereafter, the dielectric layer 220 is etched with the patterned hard mask layer 231 to form the opening 221 before or after the photoresist layer 235 is removed. Specifically, a patterned mask (not shown) is applied to cover some regions of the photoresist layer 235 to block light, so that the uncover regions of the photoresist layer 235 will be exposed to light. A solvent is then applied to the photoresist layer 235 in order to remove the cover regions or the uncover regions of the photoresist layer 235. When the photoresist layer 235 is the positive photoresist layer, the uncover region of the photoresist layer 235 is degraded and dissolved away. When the photoresist layer 235 is the negative photoresist layer, the uncover region of the photoresist layer 235 is strengthened by the light, and the solvent dissolves the covered region of the photoresist layer 235 away.

Figure 11:
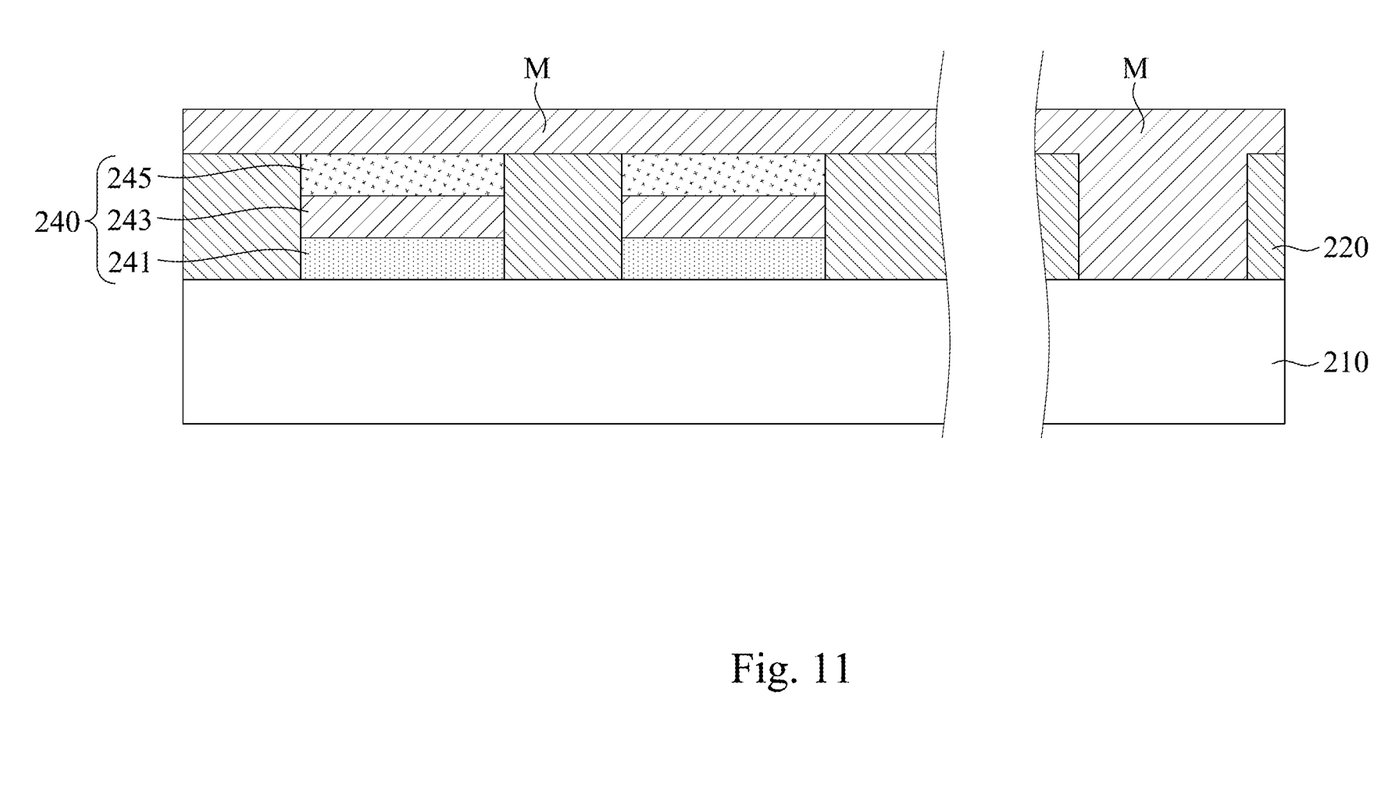
Figure 12:
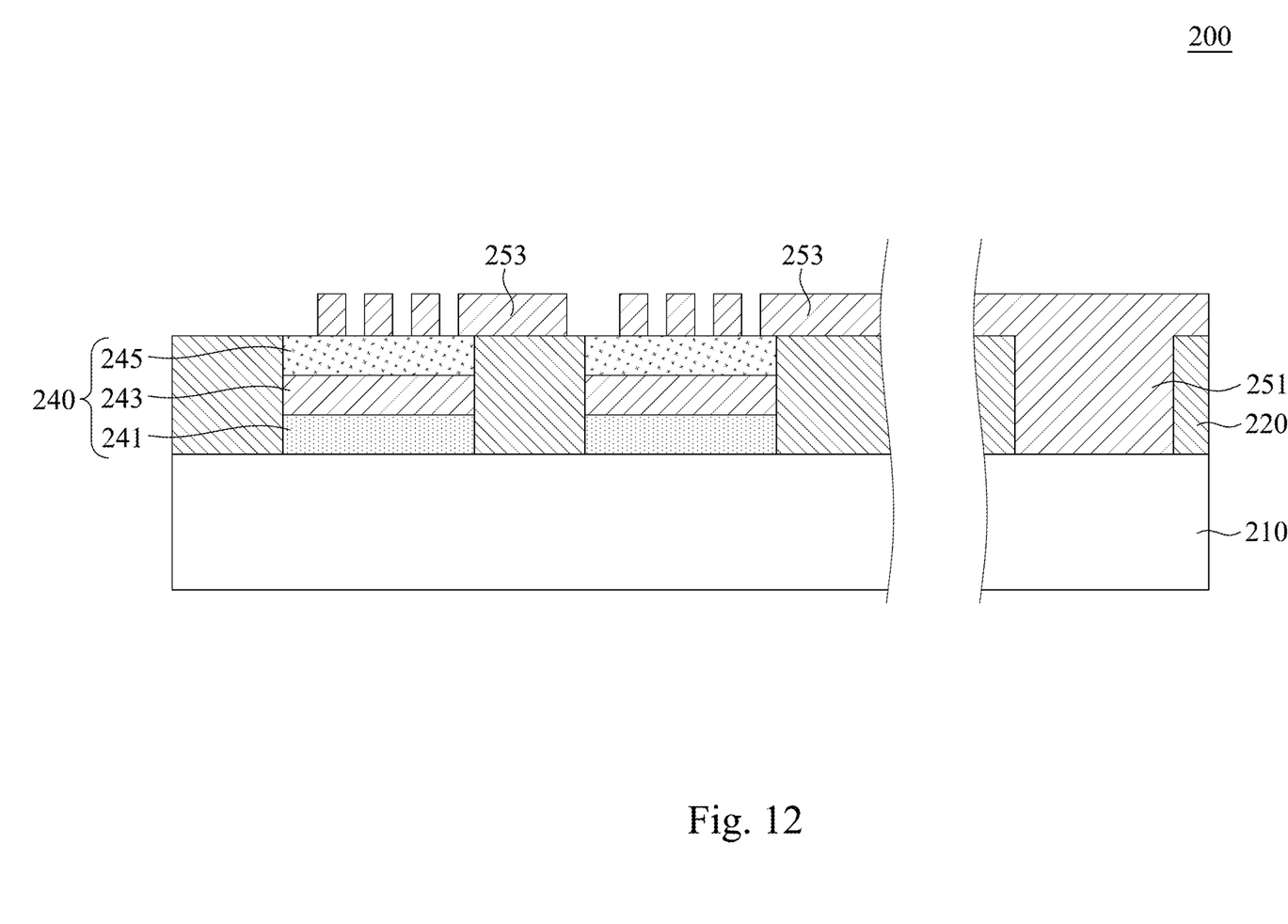

Reference is made to FIGS. 11 and 12. FIGS. 11 and 12 can represent the step 160 which includes: forming the metal layer M on the dielectric layer, in which the metal layer M fills the at least one opening 221; and performing a litho-etch process to the metal layer M to form the metal features 253 and at least one metal contact 251 in the dielectric layer 220 to get a semiconductor structure 200. The metal contact 251 can be electrically connected to one of the metal features 253 on the multi-layer structure 240 such as the dielectric film 245. The present disclosure is not limited in this respect.

Another aspect on the present disclosure is to provide a semiconductor structure 200 in FIG. 12. In some embodiments, the semiconductor structure 200 includes the substrate 210, the dielectric layer 220, the multi-layer structure 240, the metal contact 251, and the metal feature 253. Specifically, the dielectric layer 220 is disposed on the substrate 210, and the multi-layer structure 240 extends through the dielectric layer 220. The multi-layer structure 240 includes a polycrystalline layer 241, a conductive film 243, and a dielectric film 245, in which the conductive film 243 is located between the polycrystalline layer 241 and the dielectric film 245. That is, the conductive film 243 is disposed on the polycrystalline layer 241, and the dielectric film 245 is disposed on the conductive film 243. In addition, the metal feature 253 is located on the dielectric film 245, thus the dielectric film 245 is between the conductive film 243 and the metal feature 253. The metal feature 253 may be electrically connected to the metal contact 251, and the metal contact 251 can be electrically connected to a source or a drain in the substrate 210. The metal contact 251 may be electrically connected to a gate of a transistor. The present disclosure is not limited in this respect.

In summary, the present disclosure provides a multi-layer etching mask which has a HMDS layer between a photoresist layer and a hard mask layer. Therefore, the HMDS layer can provide adhesion therebetween, thus the hard mask layer can protect the structure under the multi-layer etching mask from being damaging by a deficiency thereon.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for fabricating an etching mask comprises:
   forming a hard mask layer over a first hexamethyldisilazane (HMDS) layer;
   forming a second hexamethyldisilazane (HMDS) layer over the hard mask layer; and
   forming a photoresist layer over the second HMDS layer.

2. The method of claim 1, wherein the second HMDS layer is formed by a vapor prime process.

3. The method of claim 1, wherein forming the hard mask layer comprises:
   forming a carbon-containing hard mask; and
   forming a silicon-containing hard mask over the carbon-containing hard mask.

4. The method of claim 3, wherein the carbon-containing hard mask is a spin-on carbon hard mask.

5. The method of claim 3, wherein the silicon-containing hard mask is a spin-on silicon hard mask.

6. An etching mask comprising:
   a dielectric layer;
   a multi-layer structure in the dielectric layer and comprising a polycrystalline layer, a conductive film over the polycrystalline layer, and a dielectric film over the conductive film, wherein each of the polycrystalline layer, the conductive film, and the dielectric film is in the dielectric layer;
   a hard mask layer disposed over the multi-layer structure and the dielectric layer;
   a HMDS layer disposed over the hard mask layer; and
   a photoresist layer disposed over the HMDS layer.

7. The etching mask of claim 6, wherein the hard mask layer comprises a carbon-containing hard mask and a silicon-containing hard mask disposed on the carbon-containing hard mask.

8. The etching mask of claim 7, wherein the carbon-containing hard mask is a spin-on carbon hard mask.

9. The etching mask of claim 7, wherein the silicon-containing hard mask is a spin-on silicon hard mask.

10. A method for fabricating a semiconductor structure comprises:
    providing a substrate and a dielectric layer over the substrate;
    forming a first HMDS layer over the substrate;
    forming an etching mask over the dielectric layer and the first HMDS layer, wherein the etching mask comprises:
    a hard mask layer disposed over the dielectric layer and the first HMDS layer;
    a photoresist layer disposed over the hard mask layer; and
    a second HMDS layer disposed between the hard mask layer and the photoresist layer; and
    etching the dielectric layer using the etching mask to form at least one opening therein.

11. The method of claim 10, wherein etching the dielectric layer using the etching mask to form the at least one opening therein comprises:
    patterning the photoresist layer;

patterning the hard mask layer using the patterned photoresist layer; and etching the dielectric layer using the patterned hard mask layer to form the at least one opening.

12. The method of claim 10, wherein the hard mask layer comprises a carbon-containing hard mask and a silicon-containing hard mask disposed over the carbon-containing hard mask.

13. The method of claim 12, wherein the carbon-containing hard mask is a spin-on carbon hard mask.

14. The method of claim 12, wherein the silicon-containing hard mask is a spin-on silicon hard mask.

15. The method of claim 10, wherein the second HMDS layer is formed by a vapor prime process.

16. The method of claim 10 further comprises forming at least one multi-layer structure extending through the dielectric layer.

17. The method of claim 16, wherein the at least one multi-layer structure comprises a conductive film and a dielectric film disposed over the conductive film.

18. The method of claim 17, wherein the at least one multi-layer structure further comprises a polycrystalline layer disposed under the conductive film.

19. The method of claim 10 further comprises:

forming a metal layer over the dielectric layer, wherein the metal layer fills the at least one opening; and performing a litho-etch process to the metal layer to form metal features and at least one metal contact.

* * * * *